(12) United States Patent
Saito

(10) Patent No.: US 7,733,015 B2
(45) Date of Patent: Jun. 8, 2010

(54) ORGANIC ELECTROLUMINESCENT DISPLAY DEVICE HAVING A PLANARIZING LAYER AND MANUFACTURING METHOD THEREOF

(75) Inventor: Keishi Saito, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 819 days.

(21) Appl. No.: 11/464,106

(22) Filed: Aug. 11, 2006

(65) Prior Publication Data

US 2007/0046191 A1    Mar. 1, 2007

(30) Foreign Application Priority Data

Aug. 23, 2005  (JP) .............................. 2005-241063

(51) Int. Cl.
*H01L 31/0392* (2006.01)
*H01L 31/0328* (2006.01)
*H01L 21/302* (2006.01)

(52) U.S. Cl. ...................... 313/506; 313/504; 313/507; 445/24; 257/200; 438/151

(58) Field of Classification Search ............... None
See application file for complete search history.

(56) References Cited

U.S. PATENT DOCUMENTS

| | | | | |
|---|---|---|---|---|
| 2004/0046184 A1* | 3/2004 | Yanagawa et al. | ............ | 257/200 |
| 2004/0061176 A1* | 4/2004 | Takafuji et al. | ............. | 257/347 |
| 2004/0229466 A1* | 11/2004 | Ishikawa et al. | ............ | 438/689 |
| 2005/0079803 A1* | 4/2005 | Siddiqui et al. | ............... | 451/41 |

FOREIGN PATENT DOCUMENTS

JP    10-189252    7/1998

* cited by examiner

*Primary Examiner*—Sikha Roy
*Assistant Examiner*—Tracie Green
(74) *Attorney, Agent, or Firm*—Fitzpatrick, Cella, Harper & Scinto

(57) ABSTRACT

The present invention provides an organic EL display device having a planarizing layer, which is prevented from being distorted. The above organic EL display device has a planarizing layer, which retains 5% or less the oligomer used to form this layer.

8 Claims, 3 Drawing Sheets

ORGANIC ELECTROLUMINESCENT DISPLAY DEVICE HAVING A PLANARIZING LAYER AND MANUFACTURING METHOD THEREOF

BACKGROUND OF THE INVENTION

1. Field of the Invention

The present invention is related to an organic electroluminescent display device and a manufacturing method thereof, as well as the display device having a planarizing layer between switching elements and lower electrodes.

2. Description of the Related Art

In recent years, organic electroluminescent elements (hereinafter referred to as "organic EL elements") have been actively developed.

Japanese Patent Laid-Open No. 10-189252 discloses an organic active EL light-emitting device in which thin-film transistors, an interlayer insulating film, and organic EL elements are provided.

A layer provided between switching elements, such as thin-film transistors and lower electrodes of organic electroluminescent elements, is also called a planarizing layer. The planarizing layer covers the switching elements.

Various phenomena occur when this planarizing layer is distorted.

For example, water present in the planarizing layer is discharged.

In addition, for example, due to the deformation of the planarizing layer, a wire can break and become disconnected from an electrode (such as a lower electrode of an organic EL element).

SUMMARY OF THE INVENTION

The present invention provides an organic EL display device that can solve the problems described above, which are caused by the distortion of the planarizing layer, to allow it to maintain its level of performance for a long period of time. In particular, this goal is achieved by improving the planarizing layer.

In accordance with one aspect of the present invention, there is provided an organic EL display device comprising: light-emitting elements each having a laminate composed of a lower electrode, an organic layer containing at least a light-emitting layer, and an upper electrode; switching elements for controlling light emission and non-light emission of the light-emitting elements; and a planarizing layer, which is disposed over the switching elements and under the lower electrodes. In the organic EL display device described above, the proportion of an oligomer remaining in the planarizing layer is 5% or less (hereinafter, "%" means "percent by weight" unless otherwise specifically indicated) based on the amount of the oligomer used to form the planarizing layer.

In accordance with another aspect of the present invention, there is provided a method for manufacturing an organic EL display device, comprising the steps of: forming a planarizing layer to cover switching elements disposed on a substrate; and forming lower electrodes of light-emitting elements, each having a laminate composed of a lower electrode, an organic layer containing at least a light-emitting layer, and an upper electrode. In the method described above, the step of forming a planarizing layer is a step of disposing an oligomer having a molecular weight of 500 to 5,000, followed by polymerization thereof, so that no more than 5% by weight of the oligomer remains in the planarizing layer in an non-polymerized form.

According to the present invention, when the proportion of the remaining oligomer is 5% or less, the planarizing layer is likely not distorted. Even if there is moisture in the planarizing layer, it is prevented from being discharged. As a result, the properties of the organic EL display device can be prevented from degradation.

In addition, for example, when the water wettability of the surface of the planarizing layer is improved, the adhesion thereof to the lower electrodes is also improved. As a result, the reliability of the organic EL display device is improved.

Further features of the present invention will become apparent from the following description of exemplary embodiments with reference to the attached drawings.

DESCRIPTION OF THE EMBODIMENTS

An organic EL display device of this embodiment has organic light-emitting elements, switching elements, and a planarizing layer, which is disposed over the switching elements and between the switching elements and the lower electrodes of the organic luminescent elements.

The organic light-emitting element is composed of a lower electrode, an organic layer containing at least a light-emitting layer, and an upper electrode, which are all laminated to each other.

The switching element is an element for controlling light emission and non-light emission of the light-emitting element. A transistor is an example of a switching element that can be used in the present invention. In this embodiment, a polycrystalline silicon thin-film transistor is used.

The planarizing layer contains 5% or less of the remaining oligomer.

The proportion of the remaining oligomer is determined by measuring the amount of the remaining oligomer using a part of the planarizing layer, which is obtained by grinding. Gas chromatography can be used for this measurement. When the measured amount of the remaining oligomer and the amount of a resin forming a part of the planarizing layer obtained by grinding is known, the remaining oligomer proportion can be determined.

The planarizing layer is a layer formed by applying an oligomer having a molecular weight of 500 to 5,000, followed by polymerization thereof by heat or light. In addition, the oligomer proportion in the polymerized planarizing layer is 5% or less.

Figure 1:
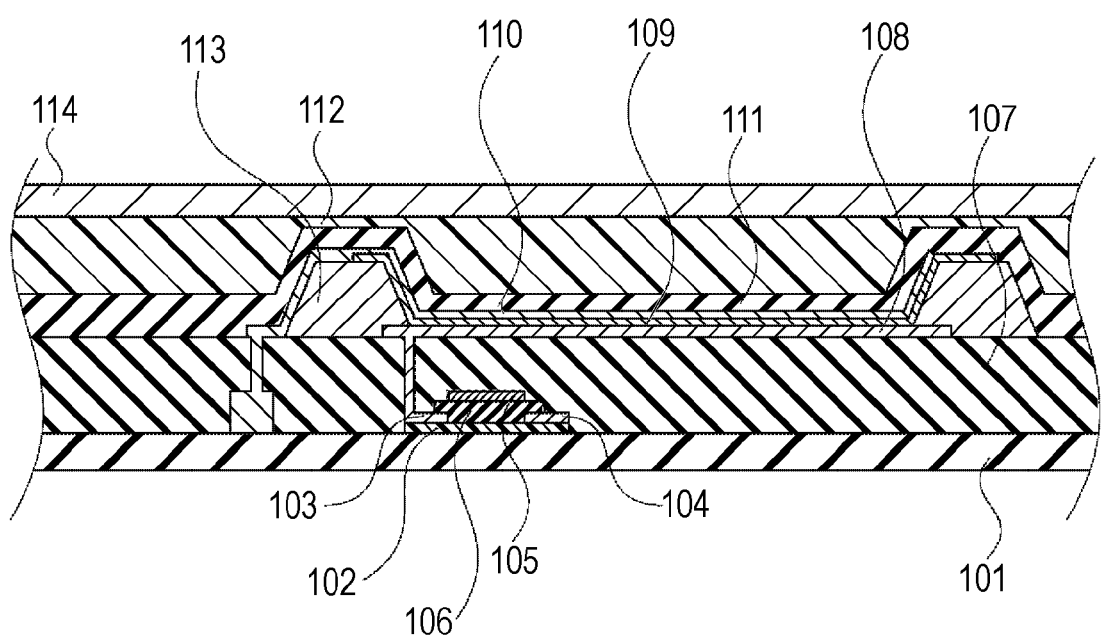
FIG. 1 is a schematic cross-sectional view of the structure of an organic EL display device according to an embodiment of the present invention.

FIG. 1 is a cross-sectional view of an organic EL display device of according to one embodiment of the present invention.

Reference numerals used in FIG. 1 are as follows. Reference numeral 101 represents a substrate, reference numeral 102 polycrystalline silicon, reference numeral 103 a source, reference numeral 104 a drain, reference numeral 105 a gate, reference numeral 106 a gate insulating layer, reference numeral 107 a planarizing layer, reference numeral 108 a lower electrode, reference numeral 109 an organic EL layer, reference numeral 110 an upper electrode, reference numeral 111 a protective layer, reference numeral 112 a filling agent, reference numeral 113 an element isolation film, and reference numeral 114 an encapsulating material.

In the organic EL display device shown in FIG. 1, a polycrystalline silicon thin-film transistor (including the polycrystalline silicon 102, source 103, drain 104, gate 105, and gate insulating layer 106) is provided on the substrate 101, which is an example of a base material. In order to planarize irregularities caused by the thin-film transistor, the insulating planarizing layer 107 is also provided.

In addition, on the planarizing layer 107, there are disposed the lower electrode 108 and the organic EL layer 109 formed of organic layers (this organic EL layer is formed of a hole injection layer, hole transport layer, light-emitting layer, electron transport layer, electron injection layer and the like (which are not shown)). Furthermore, there are provided the element isolation film 113, upper electrode 110, protective layer 111, filling agent 112, encapsulating material 114 and the like. Thus, the planarizing layer is provided over the switching element.

Figure 2:
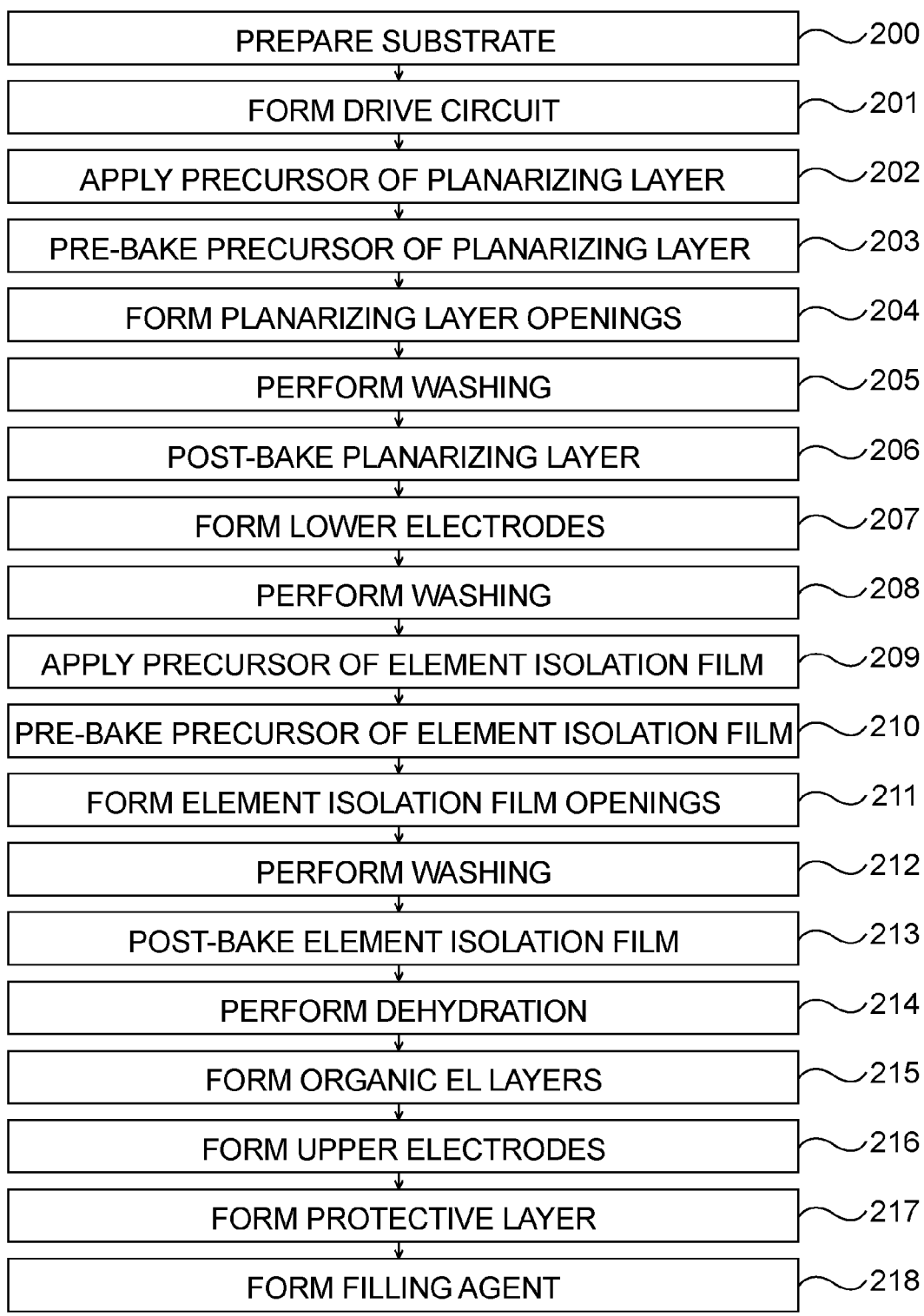
FIG. 2 is a flowchart showing a process for manufacturing an organic EL display device according to an embodiment of the present invention.

FIG. 2 is a flowchart of a process for manufacturing the organic EL display device shown in FIG. 1. Reference numerals in the figure denote respective manufacturing steps.

The process for manufacturing the organic EL display device of this embodiment is described below. First, the substrate is prepared (200) and a drive circuit formed of thin-film transistors is formed on the substrate (201). Then, a precursor (containing an oligomer) of the planarizing layer is applied onto the drive circuit (202) and pre-baked (203).

Subsequently, in order to form openings in the planarizing layer, patterning is performed by irradiation using a photolithographic method, so that planarizing layer openings are formed (204).

After the planarizing layer openings are formed, washing is performed (205), followed by post-baking (206), so that the planarizing layer is fully polymerized.

The lower electrodes are formed on the planarizing layer by evaporation, sputtering or the like (207). The lower electrodes are connected to the respective thin-film transistors at this stage.

After the formation of the lower electrodes, washing is performed (208). Subsequently, after a precursor of the element isolation film is applied (209) and then pre-baked (210), element isolation film openings are formed (211). Then, washing is performed (212), followed by post-baking of the element isolation film (213). The element isolation film is disposed so as to be in contact with the planarizing layer. In addition, the element isolation film is provided to cover a part of each lower electrode and, more specifically, is provided to cover the upper surface of each lower electrode at the periphery thereof.

The substrate provided with the planarizing layer and the element isolation film is processed by dehydration (214). Baking is an example of a dehydration process that may be used in accordance with the present invention.

After the dehydration, the organic EL layers (215), the upper electrodes are formed (216), the protective layer is formed (217), and the filling agent (filling layer) is formed (218). Then, hermetic encapsulation is performed (219) with an encapsulating material, such as glass. By the process described above, the organic EL display device is manufactured.

In this embodiment, the thin-film transistor may be either an n-channel or a p-channel transistor. In addition, besides the thin-film transistor formed of polycrystalline silicon, a thin-film transistor formed of amorphous silicon may also be preferably used. Furthermore, the thin-film transistor drive circuit formed, for example, in a two-transistor configuration or a four-transistor configuration may be used. A voltage programming drive circuit or a current programming circuit shown in FIG. 3 may be used in order to maintain a constant light-emitting intensity of the organic EL element.

In this embodiment, the planarizing layer is preferably made of a resin obtained from an oligomer having reactive functional groups, such as an acryl, epoxy, carboxyl, hydroxyl, isocyanate, amine, amide, phenol, silanol, alkylene, or thiol group. This is because the oligomer mentioned above is capable of participating an intramolecular or an intermolecular reaction.

In addition, a plurality of the above-mentioned oligomers may be mixed together to form a resin by reacting with each other.

The oligomers may be modified to contain various additives and then allowed to react.

Various additives that can be used in the present invention include, for example, a polymerization initiator, a polymerization promoter, and an anti agent for polymerization inhibition.

In addition, for example, an adhesion improver or an adhesion promoter may be used as an additive. Furthermore, various leveling agents promoting planarization and densification agents to densify the structure of the planarizing layer, the densification agents being composed, for example, of a monomer and/or a low molecular weight or a high molecular weight oligomer and/or a polymer, may be used as additives.

A resin that is a primary component of the planarizing layer, i.e., a resin obtained from the oligomer may be, for example, a melamine resin, alkyd resin, phenol resin, epoxy resin, polyester resin, polyamide resin, polyurethane resin, or maleic resin.

In addition, a poly(methyl methacrylate), polyacrylate, polycarbonate, poly(vinyl pyrrolidone), poly(vinyl alcohol), carboxylmethylcellulose, hydroxymethylcellulose or various fluorinated resins may be used as the resin.

The resins mentioned above may be transparent to visible light.

In particular, as the planarizing layer, an acrylic resin or a polyimide resin is preferably used. An acrylic resin is superior in its planarizing properties. A polyimide resin is superior in its heat resistance and is particularly suitable to be used for an element, such as an organic EL element, which generates heat.

A resin can be formed from an oligomer, for example, by a reaction performed at room temperature or at high temperature or a reaction performed by light (such as UV) or electron beam irradiation.

When the molecular weight of the oligomer is more than 5,000, its viscosity increases. As a result, it cannot be easily applied. In this case, the uniformity (such as the flatness) of the planarizing layer is reduced. In addition, water present in the oligomer (or water present in a solvent dissolving the oligomer) is liable to be trapped in the resin (i.e., the planarizing layer) obtained by a chemical reaction (polymerization).

When the molecular weight of the oligomer is less than 500, its viscosity decreases, also making it difficult to form a uniform film due to the irregularities caused by the thin-film transistors. As a result, it is not always possible to obtain a planarizing layer that functions as desired.

In addition, it was found that when the oligomer in the molecular weight range of 500 to 5,000 is allowed to react (polymerize), only 5% or less, but more than 0%, of the oligomer remaining on a weight basis is present in the planarizing layer, which is obtained by polymerizing the oligomer.

In this embodiment, the molecular weight is the value measured based on polystyrene conversion or on the standard in accordance therewith.

When the proportion of the remaining oligomer is more than 5%, the planarizing layer obtained via a chemical reaction (polymerization) is liable to be distorted. As a result, even when the temperature is increased due to light emitted from the organic EL elements for an extended period of time, moisture remaining in the planarizing layer is not likely to be discharged therefrom. Thus, the useful life of the organic EL elements is increased.

The inventor of the present invention discovered that the planarizing layer obtained from the oligomer in the above molecular weight range has a surface hardness in a specific value range. The surface hardness is preferably in the range of about 0.3 Gpa to about 0.6 Gpa.

In addition, when the surface hardness of the planarizing layer is less than 0.3 Gpa, it is believed that when a local distortion is generated, the planarizing layer may be deformed by a large force locally applied thereto (the larger the surface area of the substrate, the larger the deformation).

When a wire connecting the thin-film transistor and the organic EL element is distorted, in some case, an electrical connection problem may occur. In addition, moisture remaining in the planarizing layer is discharged, and as a result, the useful life of the organic EL element may be reduced.

On the other hand, when the surface hardness is greater than 0.6 Gpa, a local distortion is generated, and cracking and the like occur in the planarizing layer; hence, as a result, for example, degradation in the electrical contact and the decrease in light emitting intensity of the organic EL element may occur. In addition, since moisture contained in the planarizing layer is discharged through the cracks, the useful life of the organic EL element may be reduced. In addition, since the organic EL element is a current injection type element, heat is generated when it is turned on. As a result, for example, the planarizing layer may be softened and become more susceptible to deformation, a small amount of the remaining moisture may be discharged from the planarizing layer, and/or a pixel that is turned on for a long period of time may be gradually degraded by the moisture. Hence, as a result, the useful life of the organic EL element may be reduced.

The planarizing layer in the organic EL display device according to this embodiment can satisfy the above requirements. The surface hardness of the planarizing layer can be measured by a nano indenter manufactured by MTS Systems Corp., which is used to evaluate mechanical properties of a thin film. The hardness of the planarizing layer, particularly, the hardness at the surface side (that is, at the side in contact with the lower electrodes) is preferably high. On the other hand, when the planarizing layer in the vicinity of the thin-film transistors is flexible to a certain extent, the resistance against a distortion caused by an external force is improved.

A planarizing layer having a larger hardness at the surface side than that at the thin-film transistor side, for example, may be a layer in which the amount of the remaining oligomer is smaller at the surface side than that at the thin-film transistor side. That is, a planarizing layer is preferably formed in which the proportion of the remaining oligomer is gradually increased from the surface side toward the thin-film transistor side.

Next, conditions for forming the planarizing layer will be described.

The oligomer is applied by a method, such as spin coating, roll coating, or casting, to form the planarizing layer.

The reaction temperature conditions for polymerizing the oligomer are preferably set as follows. That is, the temperature is increased at a rate of 2 to 20° C./minute and is then maintained in the range of 50 to 350° C. for several minutes to several hours, so that the polymerization reaction is facilitated. A more preferable temperature range is 100° C. to 350° C. When the temperature increase rate is more than 20° C./minute, the oligomer does not uniformly react, and as a result, uniform in-plane properties of the planarizing layer cannot be obtained. In addition, when the rate is less than 2° C./minute, the planarizing layer may be decomposed by heat, or undesirable side-effects, such as degradation in film strength, film coloration, mesoporous-film formation, and the like, caused by unfavorable polymerization, may occur.

In addition, when the temperature thus maintained is more than 350° C., since evaporation or decomposition of the oligomer occurs, desired film thickness and properties cannot be obtained. In addition, a new problem may arise in that the properties of the thin-film transistor are worsened. On the other hand, when the temperature thus maintained is less than 50° C., the amount of the remaining oligomer is increased, and as a result, a desired hardness cannot be obtained.

The temperature may be increased or maintained when the polymerization is conducted in air. However, an inert gas atmosphere containing nitrogen, argon or the like is preferable.

In the organic EL display device of this embodiment, the lower electrodes and the upper electrodes are formed, for example, by evaporation or sputtering of a metal or a transparent conductive oxide.

The protective layer on the upper electrode is an insulating film made, for example, of silicon oxide, silicon nitride, or silicon oxynitride. This protective layer is transparent to visible light and is formed by a plasma CVD method or a sputtering method.

The transparent conductive oxide film and the protective layer are subjected to a large amount of stress. Hence, when the substrate or the encapsulating material is acted upon by a force and is thereby locally distorted, or when heat is generated from the organic EL element due to it being turned on for a long period of time, problems such as peeling between the planarizing layer and the lower electrode layer may occur.

Hence, it is significantly important to improve the adhesion between the planarizing layer and the lower electrode. The adhesion may be improved, for example, by irradiating the surface of the planarizing layer with ultraviolet rays or ozone, or by placing the planarizing layer in a plasma atmosphere of an oxygen gas, a nitrogen gas, a hydrogen gas, an inert gas, such as argon or helium, or a fluorinated gas.

When one of these methods is applied to the planarizing layer of the present invention, the adhesion can be improved. The adhesion is preferably set so that the contact angle to water is 80° or less.

In addition, when one of the methods described above is used, the adhesion of the planarizing layer to the element isolation film is also improved.

Furthermore, when the ozone treatment, UV treatment, or plasma treatment described above is performed on the surface of the planarizing layer, it is preferable, after the oligomer is polymerized in a nitrogen atmosphere, to anneal in an oxygen-containing atmosphere for a time shorter than that in the above nitrogen atmosphere at a temperature that is not higher than that in the nitrogen atmosphere.

In addition, the planarizing layer of the present invention may retain a metal from a metal catalyst or the like, which is used when a monomer, that is, a starting material of the oligomer, is synthesized or when the oligomer is synthesized. Such a metal may be, for example, an alkali metal or a transition metal, such as iron, nickel, chromium, molybdenum, or manganese.

However, when the amount of the remaining metal is large, the metal diffuses to the anode of the organic EL element, and as a result, the electrical properties thereof may be adversely influenced. Hence, it is preferable to remove the metal from the oligomer before polymerizing it to form the planarizing layer. For this removal, the starting material for the oligomer may be washed with alkaline water or the oligomer may be washed with alkaline water.

In the organic EL display device of the present invention, the thickness of the planarizing layer may be in the range of 1 to 4 μm, since the planarizing layer is not likely to be distorted. This thickness is preferred, for example, because it is desirable to planarize the irregularities caused by the thin-film transistors to reduce the distortion caused by an external force and reduce the influence of remaining moisture on the organic EL elements. More preferably, the thickness is set in the range of 1 to 3 μm.

In this embodiment, an insulating substrate is preferably used as the substrate 101.

Glass, glass ceramic, quartz, ceramic, or plastic, for example, may be preferably used as the substrate 101. In addition, when a conductive substrate made of silicon, metal or the like is used, a highly insulating material, such as silicon dioxide, silicon nitride, polyimide resin, or an acrylic resin, may be applied onto the substrate surface. As the resin substrate, for example, a polycarbonate, an acrylic resin, a poly (ether sulfone), a polysulfone, or a polyimide may be used.

In addition, since the organic EL element is a current injection element, the thin-film transistor is preferably a polycrystalline silicon thin-film transistor in which can accommodate a large current flow. A polycrystalline silicon used in this embodiment is preferably formed by depositing an amorphous silicon film by a plasma CVD method using a silane gas as a starting material, followed by recrystallization by an excimer laser. The thickness of the polycrystalline silicon is designed in view of the amount of current flowing through the organic EL element and the electrical properties of the polycrystalline silicon layer. However, in general, the thickness is preferably in the range of 20 to 100 nm.

Figure 3:
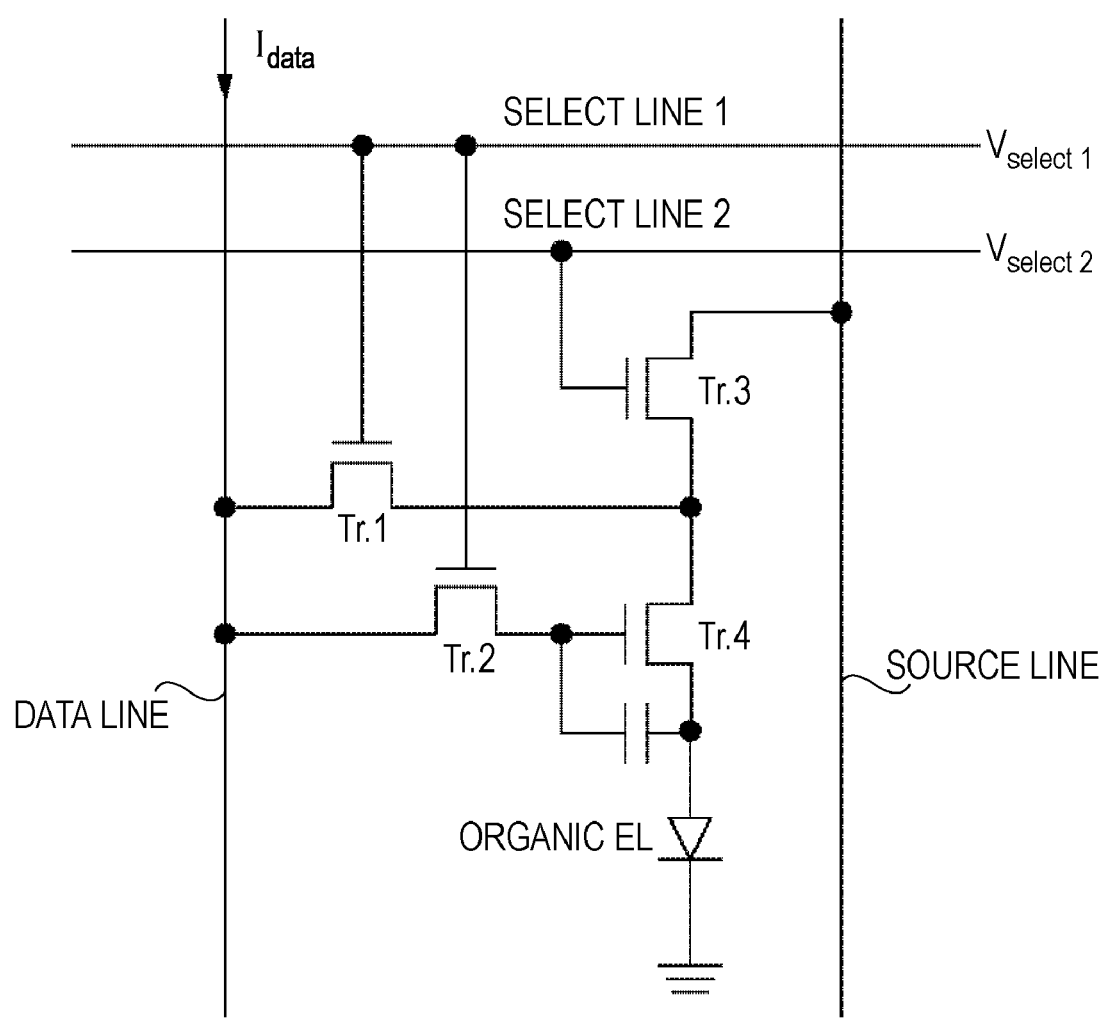
FIG. 3 is a circuit diagram of a current programming drive circuit of an organic EL display device according to an embodiment of the present invention.

FIG. 3 is a block diagram of a current programming drive circuit. The operation of this circuit is described below. First, select line 1 is placed in an ON state, and a predetermined current is allowed to flow from a data line to an organic EL element. In this step, in order to allow a desired current to flow, the voltage is stored in a gate of transistor 4 (Tr. 4). Next, select line 1 is placed in an OFF state, and select line 2 is placed in an ON state. As a result, a predetermined current is allowed to flow to the organic EL element through Tr. 4. That is, each one of transistor 1 (Tr. 1), transistor 2 (Tr. 2), and transistor 3 (Tr. 3) functions as a switch. Hence, a high ON/OFF ratio and a small OFF current are required. In addition, Tr. 4 is required to allow a large amount of current to flow therethrough. That is, when the channel width W, the channel length L and the thickness of polycrystalline silicon of a thin-film transistor are adjusted, desired transistor properties can be attained. When the channel width W is increased, and when the channel length L is decreased, the current can be increased. In addition, the thickness of the polycrystalline silicon, in view of the planarizing properties, is set to 25 to 60 nm. Furthermore, the drive circuit of the polycrystalline silicon thin-film transistor may be a p-channel or an n-channel thin-film transistor or may have a CMOS structure formed of a p-channel and an n-channel transistor. In particular, since power consumption can be reduced, the CMOS structure is a preferable embodiment.

In addition, a thin-film transistor, which has a channel made of amorphous silicon, may be used. Since the mobility of electrons is higher than that of holes, amorphous silicon may be used as an n-channel thin-film transistor. When an organic EL element drive circuit is formed from amorphous silicon, in order to allow a large current to flow, it is preferable that the gate length be decreased and that the gate width be increased as compared to the case of the polycrystalline silicon thin-film transistor.

Furthermore, as a material for the thin-film transistor, an oxide semiconductor may also be used. As the oxide semiconductor, for example, polycrystalline zinc oxide or polycrystalline or amorphous InGaZnO may be used.

The above-described planarizing layer is disposed between the substrate and the lower electrode as shown in FIG. 1. In particular, the planarizing layer is interposed between the thin-film transistor and the lower electrode so as to cover the thin-film transistor. The planarizing layer reduces the number of irregularities caused by the thin-film transistor, so that the irregularities are planarized.

It is important that the planarizing layer is not likely to be deformed by a long-term distortion of a glass substrate or by a local distortion caused by an external force. In addition, when the organic EL element is turned on for a long period of time, the temperature may increase to several tens degrees to 100° C. or may further increase to a temperature higher than that mentioned above (in some cases, to 200° C. or more).

The planarizing layer of the organic EL display device according to this embodiment is not likely to be distorted even under the circumstances described above.

When the lower electrode is used as an anode, a metal, an alloy, or an oxide conductive film having a large work function, such as 4 eV or more, is preferably used. At the organic EL element side, a laminate structure of a material having a large work function and another electrode material may also be preferably used.

Gold, platinum, molybdenum, nickel, or the like, for example, may be used as the metal. In addition, as the alloy, an alloy containing at least one of the afore-mentioned metals may be preferably used.

In addition, as the oxide conductive film, for example, tin oxide ($SnO_2$), zinc oxide (ZnO: Al) doped with aluminum, indium tin oxide (ITO), or indium zinc oxide (IZO) may be used.

The anode can be obtained by forming a thin film from one of the above electrode materials by vacuum evaporation, sputtering, plasma CVD, ion plating, electrodeposition, electric plating, non-electric plating, or the like.

When light is emitted from the anode side, the transmittance of the anode is preferably set to more than 20%. In addition, the sheet resistance of the anode is preferably 300 Ω/□ or less. Depending on the material, the thickness of the anode is set in the range of 10 nm to 2 μm. In addition, the film thickness is preferably determined considering the interference effect so as to improve the efficiency of obtaining light from the organic EL layer.

The organic EL layer shown in FIG. 1 is formed of a hole injection layer, a hole transport layer, a light-emitting layer, an electron transport layer, an electron injection layer, and the like, which are not shown in the figure.

The hole injection/transport layer is preferably a layer having superior mobility, which can make injection of holes from the anode easy and which can further transport the injected holes to the light-emitting layer.

Low molecular weight or high molecular weight materials having hole injection/transport properties may be used to form the hole injection/transport layer. Such materials may be, for example, triarylamine derivatives, phenylenediamine derivatives, triazole derivatives, oxadiazole derivatives, imidazole derivatives, pyrazoline derivatives, pyrazolone derivatives, oxazole derivatives, fluorenone derivatives, hydrazone derivatives, stilbene derivatives, phthalocyanine derivatives, porphyrin derivatives, polyvinyl carbazole, polysilylene, polythiophene, and other conductive polymers.

Of course, the low molecular weight or high molecular weight materials having hole injection/transport properties are not limited to those mentioned above.

The hole injection/transport layer preferably has a thickness of 10 to 100 nm.

As the light-emitting layer, an optional light-emitting material may be used, which emits fluorescence or phosphoresce in the visible light region and which has good film-forming properties. The light-emitting layer preferably has a thickness of 10 to 100 nm.

A material for the electron injection/transport layer may be optionally selected from materials, which can make injection of electrons from the cathode easy and which can transport the electrons thus injected to the light-emitting layer. This material may also be selected, for example, in view of the balance with the carrier mobility of the hole transport material.

Materials having electron injection/transport properties that can be used to form the electron injection/transport layer in accordance with the present invention include, for example, oxadiazole derivatives, oxazole derivatives, thiazole derivatives, thiadiazole derivatives, pyrazine derivatives, triazole derivatives, triazine derivatives, perylene derivatives, quinoline derivatives, quinoxaline derivatives, fluorene derivatives, anthrone derivatives, phenanthroline derivatives, and organic metal complexes.

Of course, the materials having electron injection/transport properties are not limited to those mentioned above. The thickness of the electron transport layer is preferably 5 to 50 nm. The thickness of the electron injection layer is preferably 10 to 100 nm.

The following structural formulas represent compounds, which may be used in the respective layers whenever necessary:

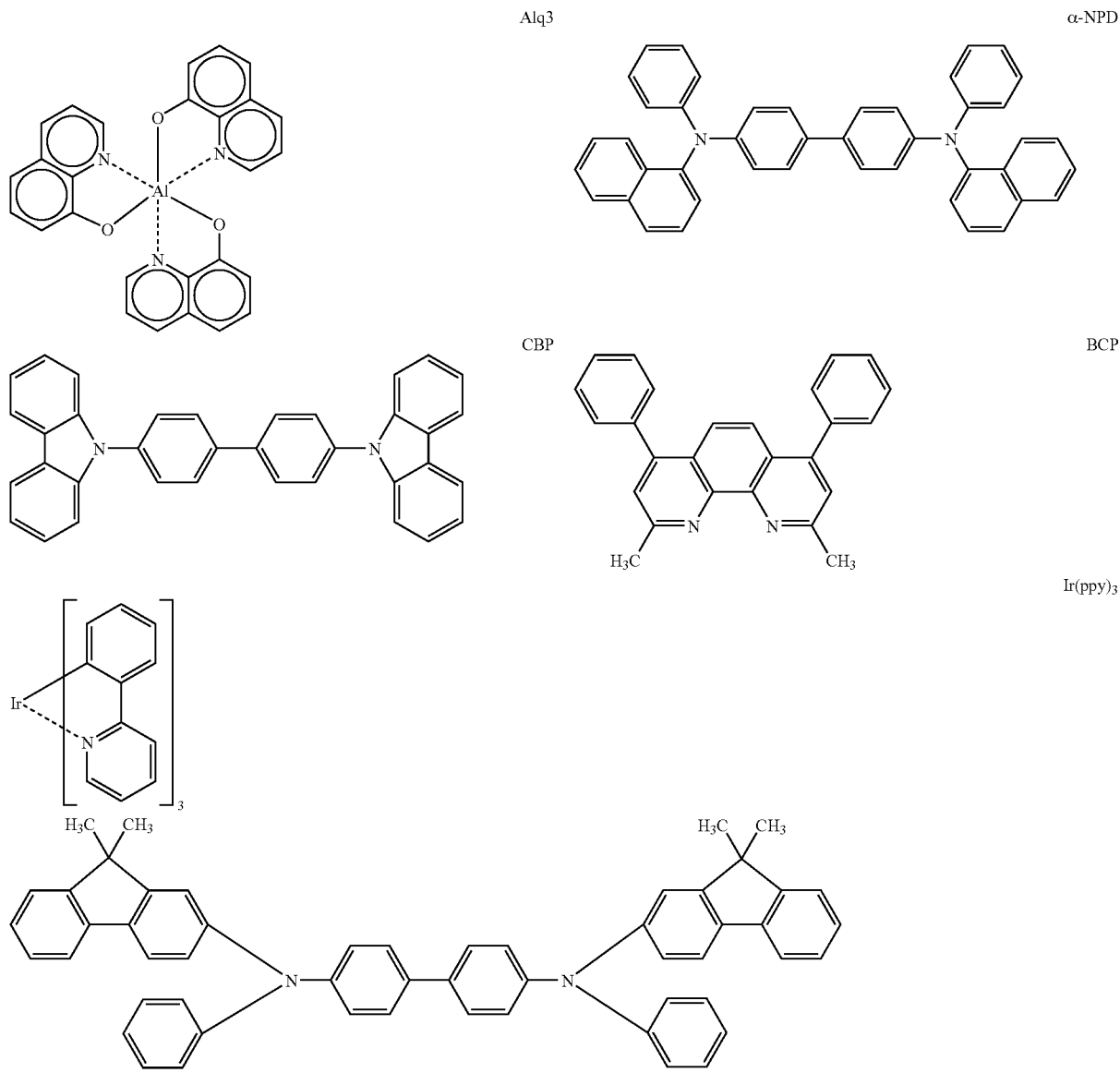

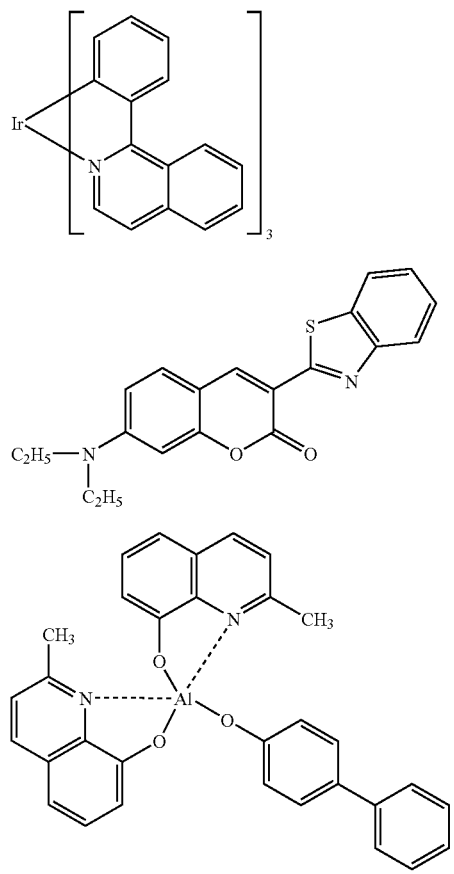

Ir(pig)₃ comarin6

Bathophenantoroline

Perylene

BAlq

The organic EL element of the present invention has an element isolation film formed so as to cover a part of the lower electrode. This element isolation film prevents short-circuiting between the lower electrode and the upper electrode and protects the edge portion of the lower electrode.

Various inorganic-based and organic-based materials may be used as a material for the element isolation film. The inorganic-based materials include, for example, insulating oxides, such as silicon oxide, silicon nitride, titanium oxide, chromium oxide, and alumina. The organic-based materials include, for example, the same materials as those that can be used for the planarizing layer, for example, polymer materials, such as acrylic, polyvinyl, polyimide, polystyrene, novolac, and silicone-based polymer materials.

Various known methods may be used to form the element isolation film. In particular, a photolithographic method using a photosensitive resin is preferred. A positive type photosensitive resin is preferably used since it can easily form a trapezoid shape. In particular, the insulating layer is preferably formed from a positive type photosensitive polyimide resin having a high hardness and superior heat resistance.

The thickness of the element isolation film of the present invention is preferably larger than that of the laminate of the organic EL element and the upper electrode provided thereon, that is, the thickness of the element isolation film of the present invention is preferably 0.1 μm or more. The insulating layer of an inorganic-based material can be patterned by an etching or a lift-off method. However, the thickness is preferably 0.1 μm or more. When an organic-based material is used, the thickness can be easily increased compared to the case when the inorganic-based material is used. Specifically, the thickness is preferably set to 0.2 μm or more. When the thickness of the element isolation film is set larger than that of the laminate of the organic EL element and the upper electrode provided thereon, the element isolation film can also be used as a spacer to prevent the damage caused by a mask when patterning is performed using a shadow mask.

When the upper electrode is used as a cathode, a material having a small work function is preferably used. The cathode materials may be, for example, metals, such as lithium, sodium, potassium, calcium, magnesium, aluminum, indium, ruthenium, titanium, manganese, yttrium, silver, lead, tin, and chromium, alloys, such as lithium-indium, sodium-potassium, magnesium-silver, aluminum-lithium, aluminum-magnesium, and magnesium-indium, and metal oxides, such as indium tin oxide (ITO). These electrode materials may be used alone or in combination. In addition, the cathode may be formed of a single layer or a laminate containing a plurality of layers. When the laminate structure is used, it is particularly preferable when a material having a small work function is used for the surface portion of the electrode at the organic EL element side. When the upper electrode is used as a cathode, the preferable thickness of the cathode is in the range of 50 to 500 nm.

The organic EL element of the present invention uses the lower electrode as an anode. However, the structure may be formed in which the lower electrode is used as a cathode. In this case, the structural arrangement of the components of the organic EL element described above may be reversed.

For the organic EL element thus formed, the protective layer is preferably provided in order to prevent oxygen, moisture, and the like from being brought into contact with the organic EL element.

The protective layer, for example, may be a diamond thin film, an inorganic material film of a metal oxide, a metal nitride, or the like, or a fluorine, a polyparaxylylene, a polyethylene, a silicone, or a polystyrene resin high molecular weight material film. A photo-curable resin may also be used.

In particular, silicon oxide, silicon nitride, silicon oxynitride, or a laminate thereof is preferably used as the protective layer.

For moisture protection and suppression of oxygen transmission, the preferable thickness of the protective layer is in the range of 100 nm to 20 μm. The thickness of the protective layer is more preferably in the range of 200 nm to 10 μm. When the thickness of the protective layer is small, sufficient moisture protection and suppression of oxygen transmission cannot be obtained. On the other hand, when the thickness of the protective layer is large, the protective layer may crack because of the deformation, distortion and the like of an organic EL element panel. When light is emitted from the upper electrode side, a light transparent protective layer is suitably used.

The filling agent may be further provided on the protective layer so as to cover the organic El element. This filling agent functions as an adhesive to bond the encapsulating material to the protective layer.

As the filling agent, for example, an acrylic, a polyvinyl chloride (PVC), an epoxy, a silicone, a polyvinyl butyral (PVB) or an ethylene vinyl acetate (EVA) resin may be used. A drying agent (not shown) is preferably provided in this filling agent since moisture absorbing properties can be maintained. In this case, the drying agent may be added to the filling agent or may be included therein. When light is emitted from the filling agent side, a light-transparent filling agent is preferably used.

In addition, as the encapsulating material, for example, a glass plate, a fiberglass-reinforced plastic (FRP) plate, a polyvinyl fluoride (PVF) film, a Mylar film, a polyester film, an acrylic film, or a metal may be used. When light is emitted from the encapsulating material side, the encapsulating material must have light-transmitting properties as is the case of the filling agent.

EXAMPLES

Hereinafter, the present invention will be described in detail with reference to the Examples. However, the present invention is not limited thereto.

Example 1

The organic EL elements shown in FIG. 1 were formed on a glass substrate 0.8 mm thick, 450 mm wide, and 550 mm long. On the glass substrate, a circuit shown in FIG. 3 was formed for each element using a low-temperature polycrystalline silicon thin film, which was recrystallized by a KrF excimer laser (wavelength of 248 nm). As a circuit protective layer, an insulating silicon nitride layer having a thickness of approximately 400 nm was deposited on the circuits by a plasma CVD method at a frequency of 13.56 MHz using a gas mixture containing a silane gas, an ammonium gas, and a hydrogen gas at a ratio of 1:1:10 as a starting material gas. A composition was prepared composed of 60% of an oligomer formed from 3% of methyl methacrylic acid and 97% of methylmethacrylate and 40% of an oligomer formed from 3% of methyl methacrylic acid and 97% of butylmethacrylate.

Subsequently, 25 parts by weight of this composition was added to 100 parts by weight of diethylene glycol methyl ethyl ether, and in addition, 1 part by weight of naphthoquinonediazido sulfonate acid ester and 2 parts by weight of a polycyclic coupling agent were added to prepare a solution. This solution was applied onto the circuit protective layer by a spin coating method so as to obtain a thickness of 1.5 μm.

Nine types of oligomers having molecular weights of 200, 400, 500, 700, 1,000, 3,000, 5,000, 6,000, and 10,000 were investigated.

First, the planarizing layer was heated to 90° C. from room temperature at a temperature increasing rate of 10° C./minute in the atmosphere and was then maintained for 2 minutes for pre-baking. Next, a pattern for forming contact holes for connection with the transistors was exposed to i line (wavelength of 365 nm) light of a mercury lamp. The exposed pattern was developed with a developer, followed by rinsing with ultra-pure running water for 2 minutes at room temperature. Subsequently, in the atmosphere, the temperature was increased to 220° C. at a temperature increasing rate of 10° C./minute and was then maintained for 60 minutes for post-baking.

Next, after UV irradiation, a Cr layer having a thickness of 100 nm was deposited by a sputtering method, and patterning was then performed by a lift-off method, so that anodes that reflect light were formed. A liquid photosensitive polyimide precursor was spin-coated onto the Cr electrodes and was then pre-baked at a relatively low temperature, followed by pattern exposure and development, so that openings were formed in the element isolation film. Next, in order to remove the developer and residues, washing was performed, and the element isolation film was post-baked at a relatively high temperature. As a result, the element isolation film was formed. After the element isolation film was formed, heating was performed at 200° C. and at a reduced pressure of 10 Pa and was then maintained for 3 hours, so that dehydration was performed.

Next, organic compound films and an upper electrode (cathode), as shown below in Table 1, were continuously formed on each of the Cr electrodes by vacuum evaporation and resistance heating in a vacuum chamber at a pressure of $10^{-4}$ Pa. The materials and the thicknesses of the films are as shown in Table 1.

TABLE 1

| Function Layer | | Material Name | Film Thickness |
|---|---|---|---|
| Hole Injection/Transport Layer | | $FLO_3$ | 70 nm |
| Light-Emitting Layer (Red) | Host | CBP | 20 nm |
| | Guest | $Ir(piq)_3$ 9% | |
| Light-Emitting Layer (Green) | Host | $Alq_3$ | 20 nm |
| | Guest | Comarin 6 1% | |
| Light-Emitting Layer (Blue) | Host | BAlq | 20 nm |
| | Guest | Perylene | |
| Electron Transport Layer | | Bathophenantroline | 50 nm |
| Electron Injection Layer | | AlLi | 1 nm |
| Upper Electrode (Cathode) | | ITO | 150 nm |

Subsequently, on the upper electrodes (ITO), a mixture of a silane gas, a nitrogen gas, and a hydrogen gas at a ratio of 3:240:200 was deposited at a thickness of 1 μm by a plasma CVD method at a film forming pressure of 100 Pa and at a frequency of 13.56 MHz. Then, as the filling agent, an acrylic adhesive was applied, followed by encapsulation with 0.7 mm thick glass.

As described above, a 200 ppi (a pixel area of 126 μm by 42 μm, and a light-emitting area of 96 μm by 96 μm) top-emission type light-emitting element panel was formed.

Measurement Method of Hardness

The hardness of the planarizing layer was measured by a nano-indentation method using an ultrafine hardness meter (sold under the trade name "Nano Indenter XP", manufactured by MTS Systems Corp.), which can measure the hardness of a thin film using a small area. A probe chip used in this measurement was a diamond-made regular triangular pyramid probe chip (Berkovich probe chip). The measurement was performed at a temperature of 24±1° C. and at a relative humidity of 55±5%. A hardness H is defined by an equation of H=P/A, where P indicates a load applied and A indicates a project area of a remaining impression obtained when an elastic deformation component is recovered after the indentation with the load P.

Method for Measuring Remaining Oligomer

After the planarizing layer was ground, and the ground material thus obtained was heated from 100° C. to 400° C. in a nitrogen atmosphere so as to release the remaining oligomer, the amount of the remaining oligomer was measured using a gas chromatograph mass spectrometry (sold under the trade name "GCMS-QP2010" manufactured by Shimadzu Corp). The proportion of the remaining oligomer was obtained by calculating a ratio of the amount of the remaining oligomer to the amount of the oligomer used for forming the planarizing layer.

Method for Evaluating of Planarizing Properties

To evaluate of the planarizing properties, the cross-section of the organic EL element panel was observed using a scanning electron microscope (SEM), and the thicknesses of the planarizing layer at the center and at the peripheral portions thereof were observed. The planarizing layer with a sufficient thickness could not be obtained using an oligomer having a small molecular weight, such as 500, as a starting material. In addition, when a planarizing layer was formed from an oligomer having a large molecular weight, such as 5,000, the solubility in a solvent was reduced and aggregation was observed after drying, so that the planarizing properties were not satisfactory.

Method for Evaluating Reliability

To evaluate the reliability of the organic EL element panel, an acceleration test was performed under practical use conditions. The organic EL element panel was turned on and was held at 100° C. for 10 hours. In addition, while still being turned on, the organic EL element panel was then held at −20° C. for 10 hours. The cycle in which temperature stimulation was applied as described above was repeatedly performed 20 times. Subsequently, the reliability was evaluated by comparing light-emitting intensity of a pixel subjected to these temperature variation conditions with that of a pixel, which was turned on at room temperature.

The evaluation results of the properties of the planarizing layers and the organic EL element panels are shown in Table 2, the planarizing layers being obtained by changing the molecular weight of the acrylic resin. By controlling the properties of the planarizing layer according to the present invention, that is, when the molecular weight of the oligomer was 500 to 5,000, the proportion of the remaining oligomer was 5% or less, and the surface hardness of the planarizing layer was 0.3 to 0.6 GPa, a superior organic EL element panel was obtained.

TABLE 2

| Sample No. | Molecular Weight of Oligomer | Hardness | Proportion of Remaining Oligomer | Planarizing Properties | Reliability |
|---|---|---|---|---|---|
| #2-1 | 200 | 0.2 GPa | 9% | x | x |
| #2-2 | 400 | 0.2 GPa | 7% | x | x |
| #2-3 | 500 | 0.3 GPa | 5% | ○ | ○ |
| #2-4 | 700 | 0.5 GPa | 3% | ○ | ○ |
| #2-5 | 1,000 | 0.6 GPa | 1% | ○ | ○ |
| #2-6 | 3,000 | 0.5 GPa | 2% | ○ | ○ |
| #2-7 | 5,000 | 0.5 GPa | 3% | ○ | ○ |
| #2-8 | 6,000 | 0.2 GPa | 6% | x | x |
| #2-9 | 10,000 | 0.2 GPa | 7% | x | x |

○: sufficient for practical use
x: insufficient for practical use

Example 2

An organic EL element panel was formed using a methacrylate oligomer having a molecular weight of 1,000, which was the oligomer used in Example 1, in a manner equivalent to that in Example 1, except that the temperature increasing rate was changed as shown in Table 3. The hardness of the planarizing layer and the amount of the remaining oligomer were measured in a manner equivalent to that in Example 1. When the temperature increasing rate was high, a non-reaction component evaporated. As a result, a desired hardness could not be obtained. In addition, the amount of the remaining oligomer was large. On the other hand, when the temperature increasing rate was low, the amount of the oligomer decomposed by heat increased. As a result, the distortion and the number of pin holes increased. To evaluate the reliability, the heat cycle between 100° C. to −20° C. was repeatedly performed 20 times while the organic EL element was turned on. Subsequently, the reliability was evaluated by comparing the light-emitting intensity of a pixel subjected to this temperature variation with that of a pixel, which was turned on at room temperature.

The results are shown in Table 3. Superior properties could be obtained at a preferable temperature increasing rate according to the present invention, that is, in the range of 2° C./minute to 20° C./minute.

TABLE 3

| Sample No. | Temperature Increasing Rate | Hardness | Proportion of Remaining Oligomer | Reliability |
|---|---|---|---|---|
| #3-1 | 1° C./min | 0.2 GPa | 6% | x |
| #3-2 | 2° C./min | 0.3 GPa | 3% | ○ |
| #3-3 | 5° C./min | 0.5 GPa | 3% | ○ |
| #3-4 | 10° C./min | 0.6 GPa | 1% | ○ |
| #3-5 | 15° C./min | 0.4 GPa | 3% | ○ |
| #3-6 | 20° C./min | 0.3 GPa | 5% | ○ |
| #3-7 | 25° C./min | 0.2 GPa | 7% | x |
| #3-8 | 30° C./min | 0.2 GPa | 8% | x |

○: sufficient for practical use
x: insufficient for practical use

Example 3

A planarizing layer having a thickness of 2 μm was deposited on a glass substrate under the same conditions as those in Example 2, in which the planarizing layer was formed at a temperature increasing rate of 10° C./minute. Cr equivalent to that forming the lower electrode was deposited on the planarizing layer by vacuum evaporation so as to have a thickness of 100 nm. Before the deposition of the Cr, the surface of the planarizing layer was left in the atmosphere for one day and was then further irradiated with UV rays right before the deposition. The surface treatment of the planarizing layer was performed by changing the time for UV irradiation. The contact angle of the planarizing layer was measured by using a measurement device sold under the trade name "Drop Master 700" manufactured by Kyowa Interface Science Co., Ltd. The results are shown in Table 4. The adhesion of Cr deposited on the surface of the planarizing layer having the contact angle as described above was evaluated by a cross-hatch test. The cross-hatch test was performed in accordance with JIS K 5600. The results are shown in Table 4. Superior adhesion was obtained when the contact angle to water was 80° or less.

TABLE 4

| Sample No. | Contact Angle | Peeling |
| --- | --- | --- |
| #4-1 | 86° | 2 |
| #4-2 | 80° | 1 |
| #4-3 | 77° | 1 |
| #4-4 | 62° | 0 |
| #4-5 | 53° | 0 |

0: Edges of cut lines are ideally smooth, and no peeling is observed in every grid.
1: Slight peeling is observed at intersections of cut lines, and 5% or less of cross-cut portions are influenced.
2: Peeling is observed along edges of cut lines or at intersections thereof. More than 5% to 15% of crosscut portions are influenced.

Example 4

An acrylic oligomer (molecular weight of 1,000) used as a starting material of the planarizing layer was stirred and washed with an aqueous solution containing 0.1% of a chelating agent (EDTA) for 10 minutes. The amount of remaining metals, which were eluted from a catalyst and a reaction chamber, was controlled by changing the number of stirring/washing times. In addition, by the method equivalent to that performed for sample #2-5 in Example 1, the planarizing layer was provided on the glass substrate. Furthermore, the amount of the remaining metals (such as Fe, Ni, and Mo) in the planarizing layer was measured by a secondary ion mass spectrometer sold under the trade name "IMS-4F" manufactured by Cameca.

In addition, by the method equivalent to that performed for sample #2-5 in Example 1, an organic EL element panel was formed. The organic EL element was turned on and was then held for 1,000 hours at a temperature of 70° C. Subsequently, the light-emitting state of each pixel was evaluated by comparing it with that of sample #5-4, which contained a small amount of remaining metals. The results are shown in Table 5. Among samples containing 150 ppm or less of the remaining metals, the light-emitting states were not significantly different from each other. However, in a sample containing 200 ppm of the remaining metals, the decrease in light-emitting efficiency was large. As described above, the samples containing a small amount of the remaining metals showed superior results.

TABLE 5

| Sample No. | Amount of Remaining Metals | Decrease in Brightness |
| --- | --- | --- |
| #5-1 | 200 ppm | 0.85 |
| #5-2 | 150 ppm | 0.95 |

TABLE 5-continued

| Sample No. | Amount of Remaining Metals | Decrease in Brightness |
| --- | --- | --- |
| #5-3 | 100 ppm | 0.97 |
| #5-4 | 10 ppm | 1 |

Example 5

When the planarizing layer was formed using the oligomer composition having a molecular weight of 5,000 used in Example 1, the temperature increasing rate and the post-baking temperature were set to 20° C./minute and 230° C., respectively. Then, a planarizing layer having a thickness of 2 μm was formed in a manner equivalent to that in Example 1. In order to measure the amount of the remaining oligomer along the thickness direction of the planarizing layer, the planarizing layer was gradually ground from the surface thereof, and then the amount of the remaining oligomer was measured using a gas chromatographic mass spectrometer sold under the trade name "GCMS-QP2010" manufactured by Shimadzu Corp., which was described in Example 1. Subsequently, the ratio to the amount of the oligomer used for forming the planarizing layer was calculated, and the proportion of the remaining oligomer was obtained.

As a result, the proportion of the remaining oligomer was 1% in a region at a depth of several hundred nanometers from the surface of the planarizing layer and was 2% in a region at a depth of 1.5 μm from the surface. As described above, in the planarizing layer formed using an oligomer having a large molecular weight at a high temperature increasing rate, the oligomer was distributed in the thickness direction of the planarizing layer, and it was understood that the proportion of the remaining oligomer increased as the depth from the surface of the planarizing layer increased.

The surface hardness of this planarizing layer was measured by a nano intender in a manner equivalent to that in Example 1. As a result, the surface hardness was 0.4 Gpa. However, as the probe chip entered the planarizing layer, the hardness decreased to 0.3 GPa.

On this planarizing layer, organic EL elements were formed, and a reliability test equivalent to that in Example 1 was performed. After the reliability test, the light-emitting state of the organic EL element panel was observed. From the observation, it was confirmed that superior results are obtained.

Example 6

The optimum thickness of the planarizing layer was investigated. A planarizing layer was formed under the same conditions as sample #2-3 in Example 1. As shown in Table 6, the thickness of the planarizing layer was investigated in the range of 0.5 to 5 μm. The thickness and the planarizing properties of the planarizing layer were obtained by observing the cross-section of the organic EL element using a scanning electron microscope (SEM). The thickness of the planarizing layer was obtained by measuring the distance from the substrate to the surface of the planarizing layer. The measurement results of the planarizing properties of the planarizing layer are shown in Table 6. By a planarizing layer of sample #6-1 having a thickness of 0.5 μm, irregularities caused by thin-film transistors and wires of the drive circuit could not be planarized. On the surface of the planarizing layer, irregularities of approximately 0.2 μm were observed.

On a planarizing layer having a thickness of 1 μm or more, irregularities, which might cause practical problems, could not be observed. For planarizing layers of samples #6-1 to #6-6 having a thickness of 0.5 to 5 μm, the reliability of the organic EL element was evaluated in a manner equivalent to that in Example 1. The results are shown in Table 6. When the thickness of the planarizing layer was in the range of 1 to 4 μm, superior results were obtained. In addition, when the thickness of the planarizing layer was in the range of 1 to 3 μm, even more superior results were obtained.

TABLE 6

| Sample No. | Thickness of Planarizing Layer | Planarizing Properties | Reliability |
|---|---|---|---|
| #6-1 | 0.5 μm | x | x |
| #6-2 | 1 μm | ○ | ○ |
| #6-3 | 2 μm | ○ | ○ |
| #6-4 | 3 μm | ○ | ○ |
| #6-5 | 4 μm | ○ | Δ |
| #6-6 | 5 μm | ○ | x |

○: sufficient for practical use
Δ: practically usable
x: insufficient for practical use While the present invention has been described with reference to exemplary embodiments, it is to be understood that the invention is not limited to these exemplary embodiments. The scope of the following claims is to be accorded the broadest interpretation so as to encompass all modifications, equivalent structures and functions.

This application claims the benefit of Japanese Application No. 2005-241063 filed Aug. 23, 2005, which is hereby incorporated by reference herein in its entirety.

What is claimed is:

1. An organic EL display device comprising:
    light-emitting elements each having a laminate comprising a lower electrode, an organic layer comprising at least a light-emitting layer, and an upper electrode;
    switching elements for controlling light emission and non-light emission of the light-emitting elements; and
    a planarizing layer, which is disposed over the switching elements and under the lower electrodes,
    wherein the planarizing layer comprises a polymer formed by polymerizing at least one oligomer such that the planarizing layer retains not more than 5% by weight of the at least one oligomer in a non-polymerized form.

2. The organic EL display device according to claim 1, wherein a surface hardness of the planarizing layer is from 0.3 to 0.6 GPa.

3. The organic EL display device according to claim 1, wherein a contact angle of the planarizing layer to water is 80° or less.

4. The organic EL display device according to claim 1, wherein the planarizing layer comprises 150 ppm or less of a metal.

5. The organic EL display device according to claim 1, wherein the planarizing layer comprises an acrylic resin.

6. A method for manufacturing an organic EL display device, comprising the steps of:
    forming a planarizing layer over switching elements disposed on a substrate; and
    forming lower electrodes of light-emitting elements each having a laminate comprising a lower electrode, an organic layer comprising at least a light-emitting layer, and an upper electrode,
    wherein the step of forming a planarizing layer comprises disposing at least one oligomer having a molecular weight of 500 to 5,000 and polymerizing the at least one oligomer such that the planarizing layer retains not more than 5% of the at least one oligomer in a non-polymerized form.

7. The method for manufacturing an organic EL display device according to claim 6, wherein the polymerization is performed by heat and/or light.

8. The method for manufacturing an organic EL display device according to claim 6, wherein a temperature during the polymerization is increased at a rate of 2 to 20° C./minute.

* * * * *